(12) United States Patent
Cheng et al.

(10) Patent No.: US 9,614,077 B1
(45) Date of Patent: Apr. 4, 2017

(54) VERTICAL FINFET WITH STRAINED CHANNEL

(71) Applicant: International Business Machines Corporation, Armonk, NY (US)

(72) Inventors: Kangguo Cheng, Schenectady, NY (US); Ramachandra Divakaruni, Ossining, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/060,124

(22) Filed: Mar. 3, 2016

(51) Int. Cl.
*H01L 29/94* (2006.01)
*H01L 21/00* (2006.01)
*H01L 21/338* (2006.01)
*H01L 21/337* (2006.01)
*H01L 29/78* (2006.01)
*H01L 29/08* (2006.01)
*H01L 29/10* (2006.01)
*H01L 29/423* (2006.01)
*H01L 21/02* (2006.01)
*H01L 29/66* (2006.01)

(52) U.S. Cl.
CPC .... *H01L 29/7827* (2013.01); *H01L 21/02532* (2013.01); *H01L 29/0847* (2013.01); *H01L 29/1037* (2013.01); *H01L 29/42356* (2013.01); *H01L 29/42364* (2013.01); *H01L 29/42376* (2013.01); *H01L 29/66666* (2013.01); *H01L 29/7842* (2013.01)

(58) Field of Classification Search
CPC ............. H01L 29/66795; H01L 29/732; H01L 29/7371; H01L 29/7788; H01L 29/7827; H01L 29/7834; H01L 29/785; H01L 21/823412; H01L 21/823821; H01L 21/823487
USPC .......... 257/24, 302, 328; 438/156, 173, 192, 438/206, 212
See application file for complete search history.

(56) References Cited

U.S. PATENT DOCUMENTS

| | | | |
|---|---|---|---|
| 7,211,864 B2 | 5/2007 | Seliskar | |
| 7,217,974 B2 | 5/2007 | Forbes et al. | |
| 8,247,275 B2 | 8/2012 | Hoentschel et al. | |
| 8,629,478 B2 | 1/2014 | Ko et al. | |
| 8,860,138 B2 | 10/2014 | Doris et al. | |
| 8,890,255 B2 | 11/2014 | Kanakasabapathy et al. | |
| 2005/0205932 A1* | 9/2005 | Cohen | H01L 21/82341 257/347 |
| 2008/0128760 A1* | 6/2008 | Jun | B82Y 10/00 257/280 |
| 2014/0008736 A1 | 1/2014 | Li et al. | |
| 2015/0243784 A1 | 8/2015 | Morin | |
| 2015/0279997 A1 | 10/2015 | Koldiaev et al. | |

* cited by examiner

*Primary Examiner* — Hsien Ming Lee
(74) *Attorney, Agent, or Firm* — Scully, Scott, Murphy & Presser, P.C.; Jennifer R. Davis, Esq.

(57) ABSTRACT

A vertical transistor including a strained vertical semiconductor material channel pillar and a method of forming the same are provided. A strained vertical semiconductor materials pillar is first formed and is used to provide the strained vertical semiconductor material channel pillar of the vertical transistor of the present application. The strained vertical semiconductor material pillar is always mechanically anchored during various vertical transistor processing steps so that in the final structure strain is preserved.

19 Claims, 9 Drawing Sheets

VERTICAL FINFET WITH STRAINED CHANNEL

BACKGROUND

The present application relates to a semiconductor structure and a method of forming the same. More particularly, the present application relates to a vertical transistor containing a strained semiconductor material channel pillar flanked on either side by a functional gate structure. The present application also relates to a method of forming such a vertical transistor.

Conventional vertical transistors are devices where the source-drain current flows in a direction normal to the substrate surface. In such devices, a vertical semiconductor pillar defines the channel with the source region and the drain region located at opposing ends of the semiconductor pillar. One advantage of vertical transistors is the decoupling of the gate length from the contact gate pitch. Therefore, vertical transistors have been explored as a viable device option for continued complementary metal oxide semiconductor (CMOS) scaling beyond the 7 nm technology node.

Strain engineering is highly desired for enhancing carrier mobility and thus the drive current of vertical transistors. Unlike conventional horizontal transistors, it is very difficult to maintain the strain in a vertical semiconductor pillar that defines the channel of the vertical transistor because vertically standing semiconductor pillars will become relaxed regardless of their initial strain status. There is thus a need for forming a vertical transistor while preserving the strain of the vertical semiconductor pillar that defines the channel of the vertical transistor throughout the entire fabrication process.

SUMMARY

A vertical transistor including a strained vertical semiconductor material channel pillar and a method of forming the same are provided. In the present application, a strained vertical semiconductor material pillar is first formed and is used to provide the strained vertical semiconductor material channel pillar of the vertical transistor of the present application. The strained vertical semiconductor material pillar is always mechanically anchored during various vertical transistor processing steps so that in the final structure strain is preserved.

In one aspect of the present application, a semiconductor structure (i.e., a vertical transistor) is provided. In one embodiment of the present application, the semiconductor structure includes a strained semiconductor material channel pillar located above a substrate. A first functional gate structure is located on a first sidewall of the strained semiconductor material channel pillar and a second functional gate structure is located on a second sidewall surface of the strained semiconductor material channel pillar. A first (i.e., bottom) source/drain structure is in contact with a bottommost surface of the strained semiconductor material channel pillar and extends beneath the first and second functional gate structures, and a second source/drain structure is in contact with a topmost surface of the strained semiconductor material channel pillar and extends above the first and second functional gate structures.

In another aspect of the present application, a method of forming a semiconductor structure (i.e., vertical transistor) is provided. In one embodiment of the present application, the method includes forming at least one silicon germanium mandrel structure on a surface of a substrate, wherein the at least one silicon germanium mandrel structure is strained. Next, a strained semiconductor material pillar is formed on opposing sidewalls of the at least one silicon germanium mandrel structure. With the at least one silicon germanium mandrel structure present, a first portion of a source/drain structure is formed within a bottom portion of each strained semiconductor material pillar, and thereafter a first functional gate structure is formed on one side of each strained semiconductor material pillar. Next, the at least one silicon germanium mandrel structure is removed with the first functional gate stack in place to maintain the strain of each of the strained semiconductor material pillars. On another side of each strained semiconductor material pillar, a second portion of the first source/drain structure and a second functional gate structure are formed. Next, a second source/drain structure is formed above the first and second functional gate structures and in contact with a topmost surface each of the strained semiconductor material pillars.

DETAILED DESCRIPTION

Figure 1:
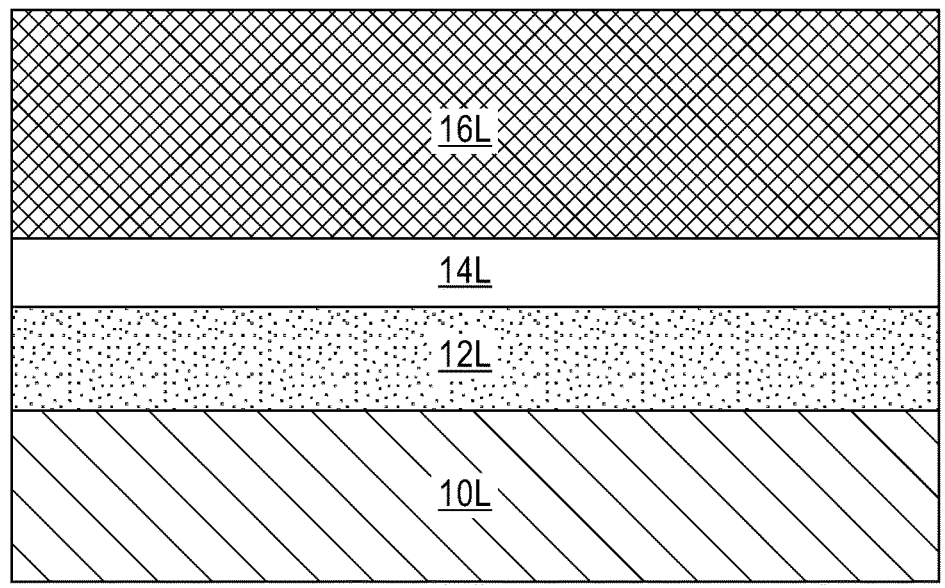
FIG. 1 is a cross sectional view of an exemplary semiconductor structure including, from bottom to top, a handle substrate, an insulator layer, a silicon layer, and a sacrificial silicon germanium alloy layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including, from bottom to top, a handle substrate 10L, an insulator layer 12L, a silicon layer 14L, and a sacrificial silicon germanium alloy layer 16L that can be employed in accordance with an embodiment of the present application. Collectively, the handle substrate 10L, the insulator layer 12L and the silicon layer 14L may be referred to as a silicon-on-insulator (SOI) substrate.

In some embodiments, a bulk silicon substrate can be used in place of the SOI substrate. In such an embodiment, it is possible to avoid the converting process mentioned below, and to form silicon germanium mandrel structures (to be described in greater detail herein below) directly from the sacrificial silicon germanium alloy layer that is formed on an exposed surface of the bulk silicon substrate.

In one embodiment of the present application and as shown in FIG. 1, the handle substrate 10L may include at least one semiconductor material that has semiconducting properties. Examples of materials that have semiconducting properties and thus can be employed as the semiconductor material that provides the handle substrate 10L include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the handle substrate 10L is composed entirely of silicon.

In another embodiment of the present application, the handle substrate 10L may be composed of a non-semiconductor material including, for example, a dielectric material and/or a conductive material.

When the handle substrate 10L is composed of at least one semiconductor material, the at least one semiconductor material that provides the handle substrate 10L may be single crystalline, polycrystalline or amorphous. In one example, the handle substrate 10L is composed of single crystalline silicon. When the handle substrate 10L is composed of at least one semiconductor material, the at least one semiconductor material that provides the handle substrate 10L may have any of the well known crystal orientations. For example, the crystal orientation of the handle substrate 10L may be {100}, {110}, or {111}. Other crystallographic orientations besides those specifically mentioned can also be used in the present application.

The insulator layer 12L of the exemplary semiconductor structure shown in FIG. 1 may be a crystalline or non-crystalline dielectric material such as an oxide and/or nitride. In one embodiment, the insulator layer 12L is a dielectric oxide such as, for example, silicon dioxide. In another embodiment of the present application, the insulator layer 12L may be a dielectric nitride such as, for example, silicon nitride or boron nitride. In yet another embodiment of the present application, the insulator layer 12L may include a stack of a dielectric oxide and a dielectric nitride. In one example, a stack of, in any order, silicon dioxide and silicon nitride or boron nitride may be employed as the insulator layer 12L. The insulator layer 12L may have a thickness from 10 nm to 200 nm, although other thicknesses that are lesser than, or greater than, the aforementioned thickness range may also be employed as the thickness of the insulator layer 12L.

The silicon layer 14L that is present on the insulator layer 12L is typically a single crystalline semiconductor material that has one of the crystallographic orientations mentioned above for the handle substrate 10L. The silicon layer 14L may have a thickness from 10 nm to 100 nm, although other thicknesses that are lesser than, or greater than, the aforementioned thickness range may also be employed as the thickness of the silicon layer 14L.

In one embodiment, the SOI substrate (10L, 12L, 14L) may be formed by wafer bonding. In yet another embodiment, the SOI substrate (10L, 12L, 14L) may be formed by an implantation process known as SIMOX (i.e., Separation by IMplanting OXygen).

After providing the SOI substrate (10L, 12L, 14L), the sacrificial silicon germanium alloy layer 16L is formed on an exposed surface of the silicon layer 14L. The sacrificial silicon germanium alloy layer 16L can be formed utilizing an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present embodiment, the sacrificial silicon germanium alloy layer 16L has an epitaxial relationship with the growth surface of the silicon layer 14L of the SOI substrate.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of sacrificial silicon germanium alloy layer 16L can be performed utilizing any well known silicon germanium precursor gas or gas mixture including for example, a gas mixture of a silicon containing precursor gas (such as silane) and a germanium containing precursor gas (such as a germane). Carrier gases like hydrogen, nitrogen, helium and argon can be used.

The sacrificial silicon germanium alloy layer 16L is a strained silicon germanium alloy. Notably, the sacrificial silicon germanium alloy layer 16L has an in-plane lattice constant that matches the lattice constant of the silicon layer 14L. The sacrificial silicon germanium alloy layer 16L however has a vertical lattice constant that is substantially higher than a relaxed silicon germanium alloy layer having an equivalent germanium content due to strain-stress relation. In some embodiments of the present application, the sacrificial silicon germanium alloy layer 16L is compressively strained in a horizontal direction and tensily strained in a vertical direction.

The sacrificial silicon germanium alloy layer 16L has a first germanium content. In one embodiment of the present application, the first germanium content of the sacrificial silicon germanium alloy layer 16L can be from 20 atomic percent germanium to 40 atomic percent germanium. Other first germanium contents are also possible for the sacrificial silicon germanium alloy layer 16L. The sacrificial silicon germanium alloy layer 16L may have a thickness from 20 nm to 100 nm. Other thicknesses that are lesser than 20 nm, and greater than 100 nm may also be used as the thickness of the sacrificial silicon germanium alloy layer 16L.

Figure 2A:
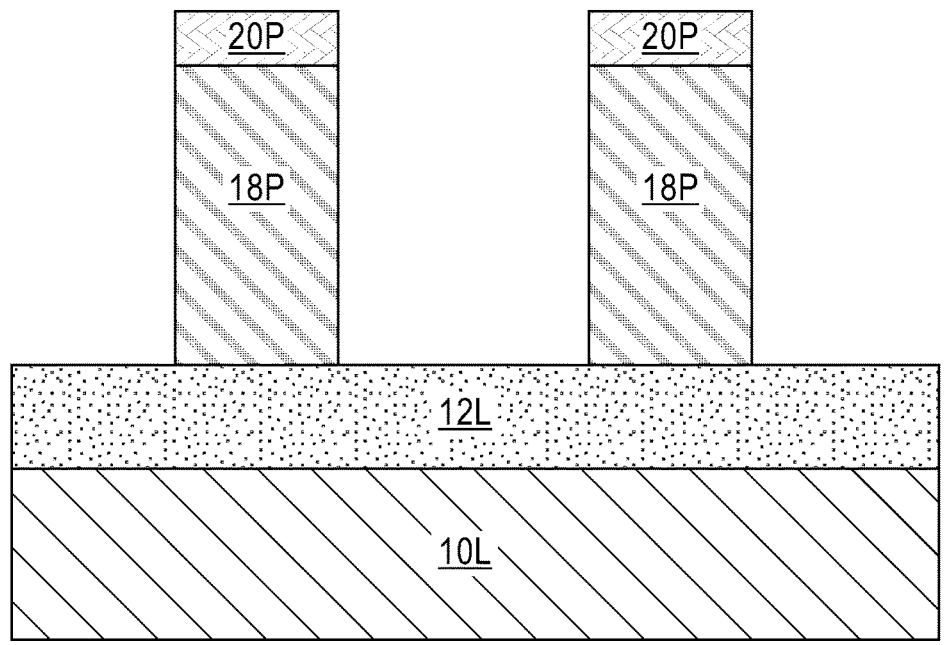
FIG. 2A is a cross sectional view of the exemplary semiconductor structure of FIG. 1 after converting the sacrificial silicon germanium alloy layer and the silicon layer into a silicon germanium alloy layer, and thereafter patterning the silicon germanium alloy layer to form silicon germanium mandrel structures.
Figure 2B:
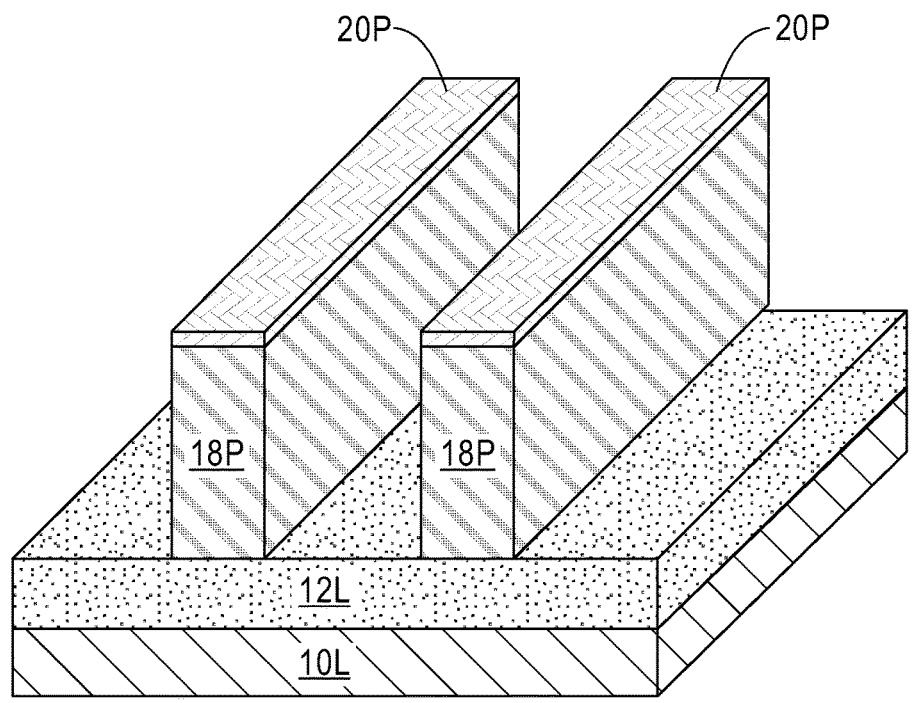
FIG. 2B is a three dimensional representation of the exemplary semiconductor structure of FIG. 2A.

Referring now to FIGS. 2A-2B, there are shown various views of the exemplary semiconductor structure of FIG. 1 after converting the sacrificial silicon germanium alloy layer 16L and the silicon layer 14L into a silicon germanium alloy layer (not shown), and thereafter patterning the silicon germanium alloy layer to form silicon germanium mandrel structures 18P. Each silicon germanium mandrel structure 18P is strained; the strain of each silicon germanium mandrel structure 18P matches that of the sacrificial silicon germanium alloy layer 16L mentioned above. In one embodiment, each silicon germanium mandrel structure 18P is compressively strained in a horizontal direction and tensily strained in a vertical direction.

In one embodiment, the conversion of the sacrificial silicon germanium alloy layer 16L and the silicon layer 14L into a silicon germanium alloy layer includes a thermal anneal. In one embodiment, the thermal anneal may be performed in an oxidizing ambient (air, oxygen, ozone and/or $NO_2$). Such an oxidation process is referred to as condensation process. The thermal anneal temperature can be from 600° C. to 1200° C. During the thermal anneal (condensation), the sacrificial silicon germanium alloy layer 16L and the silicon layer 14L are converted into a single silicon germanium alloy layer having a second germanium content that is less than the first germanium content of the sacrificial silicon germanium alloy layer 16L. Alternatively, the thermal anneal process can be performed in an inert ambient (helium, nitrogen, argon, etc.). During the thermal anneal, germanium in the original silicon germanium layer diffuses into the silicon layer underneath so that a single silicon germanium is formed after anneal. As mentioned above, in some embodiments of the present application and when a bulk silicon substrate is employed, the thermal anneal step may be omitted.

A surface oxide (not shown) is formed on the exposed surface of the silicon germanium alloy layer having the second germanium content after the condensation process. The surface oxide may be removed after formation of the silicon germanium alloy layer having the second germanium content utilizing a selective wet etch process. In some embodiments, the surface oxide may remain and serve as a hard mask layer. The silicon germanium alloy layer having the second germanium content may have a thickness from 20 nm to 100 nm. Other thicknesses are also possible depending upon the thicknesses of the silicon layer 14L and the sacrificial silicon germanium alloy layer 16L that were initially employed.

After providing the silicon germanium alloy layer having the second germanium content, a hard mask layer (not shown) can be formed over an exposed surface of the silicon germanium alloy layer having the second germanium content. The hard mask layer is a contiguous layer that covers the entirety of the silicon germanium alloy layer having the second germanium content. The hard mask layer that is employed in the present application may include a dielectric oxide, a dielectric nitride and/or a dielectric oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride. In embodiments when thermal anneal is not used, a hard mask layer can be formed directly upon the sacrificial silicon germanium alloy layer 16L mentioned above.

In some embodiments, the hard mask material that can be used in providing the hard mask layer can be formed by a deposition process such as, for example, chemical vapor deposition (CVD) or plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 10 nm to 40 nm. Other thicknesses that are lesser than, or greater than, the aforementioned thickness range may also be employed as the thickness of the hard mask layer.

After providing the hard mask layer and in the illustrated embodiment, the hard mask layer and the silicon germanium alloy layer having the second germanium content are patterned to provide the silicon germanium mandrel structures 18P shown in FIGS. 2A and 2B. In cases when thermal condensation is not employed, a material stack of the hard mask layer and the sacrificial silicon germanium alloy layer 16L is patterned to provide the structure shown in FIGS. 2A and 2B. As is shown, each silicon germanium mandrel structures 18P is capped with a remaining portion of the hard mask layer. The remaining portion of the hard mask layer that is located on each silicon germanium mandrel structure 18P may be referred to herein as a hard mask portion 20P. Although the present application illustrates the formation of two silicon germanium mandrel structures 18P, the present application is not limited to the formation of two silicon germanium mandrel structures 18P. Instead, the present application may be employed when a single silicon germanium mandrel structure 18P is formed, or more than two silicon germanium mandrel structures 18P are formed.

In the embodiment illustrated, each silicon germanium mandrel structure 18P has a bottommost surface that contacts a topmost surface of the insulator layer 12L. Each silicon germanium mandrel structure 18P has sidewall surfaces that are vertically aligned with the sidewall surfaces of an overlying hard mask portion 20P. Each silicon germanium mandrel structure 18P has a height that is the same as the height mentioned above for the silicon germanium alloy layer having the second germanium content or, alternatively, the sacrificial silicon germanium alloy layer 16L. Each silicon germanium mandrel structure 18P can have a width, as measured from one sidewall to an opposing sidewall, of from 15 nm to 60 nm. Other widths are possible and can be employed in the present application for the width of each silicon germanium mandrel structure 18P. Each silicon germanium mandrel structure 18P has substantially the same strain as the sacrificial silicon germanium alloy layer 16L. In some embodiments of the present application, each silicon germanium mandrel structure 18P is tensily strained in a vertical direction.

The patterning process used to define the exemplary semiconductor structure shown in FIGS. 2A-2B may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing.

In another embodiment, the patterning process used to define the exemplary semiconductor structure shown in FIGS. 2A-2B may include a sidewall image transfer (SIT) process. In yet another embodiment, the patterning process used to define the exemplary semiconductor structure shown in FIGS. 2A-2B may include a direct self-assembly (DSA) patterning process.

Figure 3A:
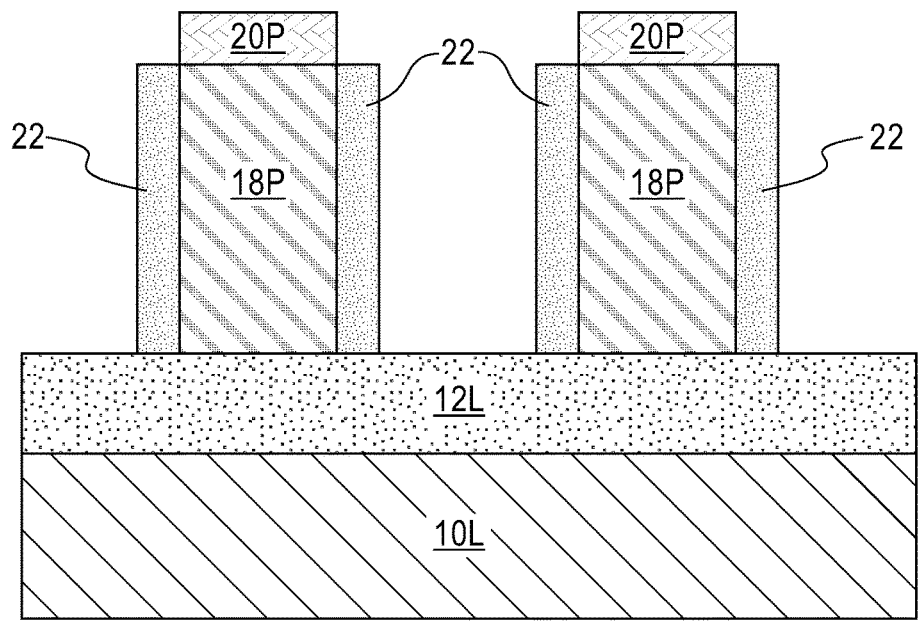
FIG. 3A is a cross sectional view of the exemplary semiconductor structure of FIG. 2A after forming a strained semiconductor material pillar on each sidewall of each silicon germanium mandrel structure.
Figure 3B:
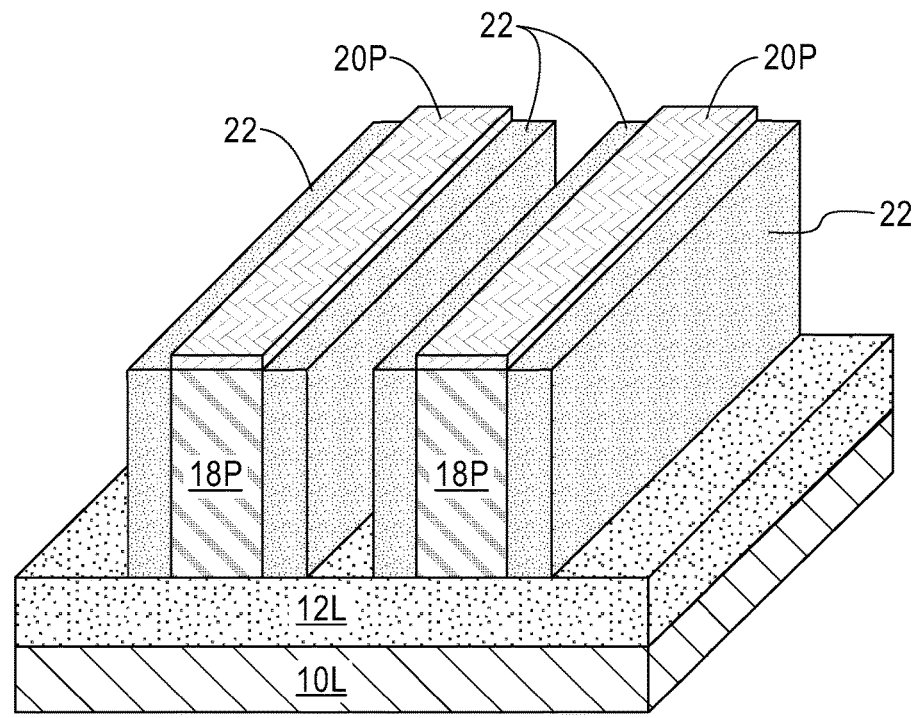
FIG. 3B is a three dimensional representation of the exemplary semiconductor structure of FIG. 3A.

Referring now to FIGS. 3A-3B, there are illustrated the exemplary semiconductor structure of FIGS. 2A-2B after forming a strained semiconductor material pillar 22 on each sidewall of each silicon germanium mandrel structure 18P. As is shown, a strained semiconductor material pillar 22 is formed on opposing sidewalls of each silicon germanium mandrel structure 18P. As such, a pair of strained semiconductor material pillars 22 is formed on each sidewall surface of one of the silicon germanium mandrel structures 18P.

Each strained semiconductor material pillar 22 that is formed in the illustrated embodiment has a bottommost surface that contacts a portion of the topmost surface of the insulator layer 12L. Each strained semiconductor material pillar 22 that is formed has a topmost surface that is coplanar with a topmost surface of each silicon germanium mandrel structure 18P. Each strained semiconductor material pillar 22 has an epitaxial relationship with one of the sidewall surfaces of the silicon germanium mandrel structures 18P. Each strained semiconductor material pillar 22 has a width that is less than a width of each silicon germanium mandrel structure 18P. In one example, each strained semiconductor material pillar 22 has a width from 3 nm to 15 nm. Other widths are possible and can be employed in the present application.

Each strained semiconductor material pillar 22 is formed utilizing an epitaxial growth (or deposition) as mentioned above. Unlike the previous epitaxial growth process used to form the silicon germanium alloy having the first germanium content which occurs upwards, the epitaxial growth of strained semiconductor material pillar 22 is a lateral growth from the sidewall surfaces of the silicon germanium mandrel structure 18P.

Each strained semiconductor material pillar 22 comprises a semiconductor material that has a lattice contact that differs from the lattice constant of the silicon germanium mandrel structure 18P. In one example, each strained semiconductor material pillar 22 comprises silicon. In another example, each strained semiconductor material pillar 22 comprises germanium. In yet another example, each strained semiconductor material pillar 22 comprises a III-V compound semiconductor. In still another example, each strained semiconductor material pillar comprises a silicon germanium alloy having a different germanium content than the germanium content of the silicon germanium mandrel structure 18P.

In some embodiments of the present application, and when each strained semiconductor material pillar 22 comprises silicon, each strained semiconductor material pillar 22 has a vertical tensile strain due to the greater out of plane (vertical direction) lattice spacing of the silicon germanium mandrel structures 18P than the out of plane lattice spacing of the semiconductor material pillar 22. In other embodiments of the present application, and when each strained semiconductor material pillar 22 comprises germanium, each strained semiconductor material pillar 22 has a vertical compressive strain. In still another embodiment of the present application, and when each strained semiconductor material pillar 22 comprises a III-V compound semiconductor, each strained semiconductor material pillar 22 has a vertical tensile strain. In yet another embodiment, and when each strained semiconductor material pillar 22 comprises silicon germanium, each strained semiconductor material pillar 22 has a compressive strain.

Figure 4:
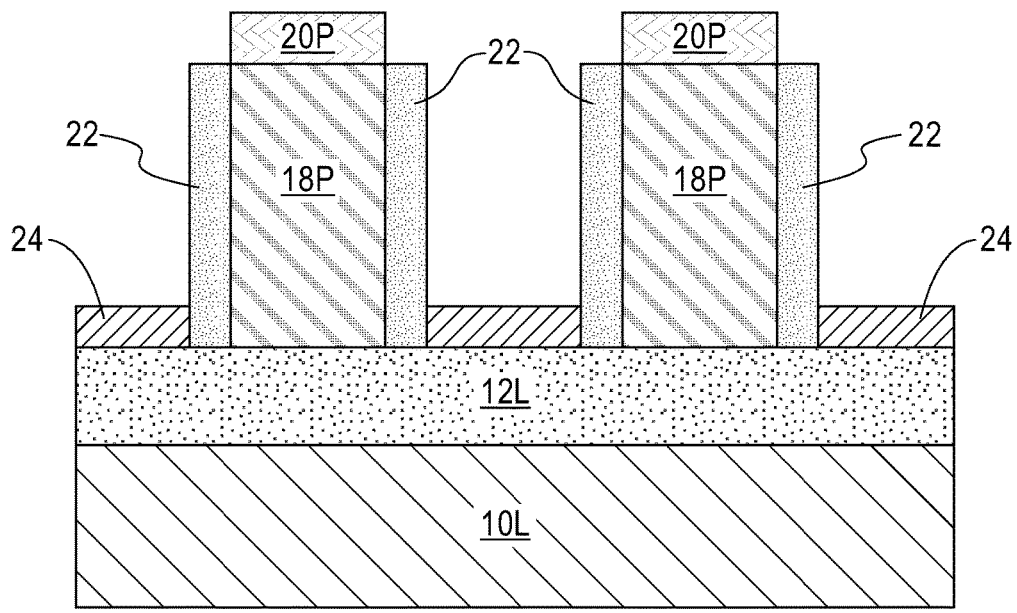
FIG. 4 is a cross sectional view of the exemplary semiconductor structure of FIG. 3A after forming a sacrificial dielectric material layer on the exposed portions of the insulator layer.

Referring now to FIG. 4, there is illustrated the exemplary semiconductor structure of FIGS. 3A-3B after forming a sacrificial dielectric material layer 24 on the exposed portions of the insulator layer 12L. The sacrificial dielectric material layer 24 has at least one sidewall surface that contacts an outermost sidewall of one of the strained semiconductor material pillars 22. The sacrificial dielectric material layer 24 has a height that is less than a height of each strained semiconductor material pillar 22.

The sacrificial dielectric material layer 24 comprises a dielectric material that has a different etch selectivity than the hard mask layer used to form the hard mask portions 20P. In one example, and when the hard mask material comprises silicon dioxide, the sacrificial dielectric material layer 24 comprises silicon nitride or silicon oxynitride. The sacrificial dielectric material layer 24 can be formed by deposition of a dielectric material, followed by performing a recess etch.

Figure 5:
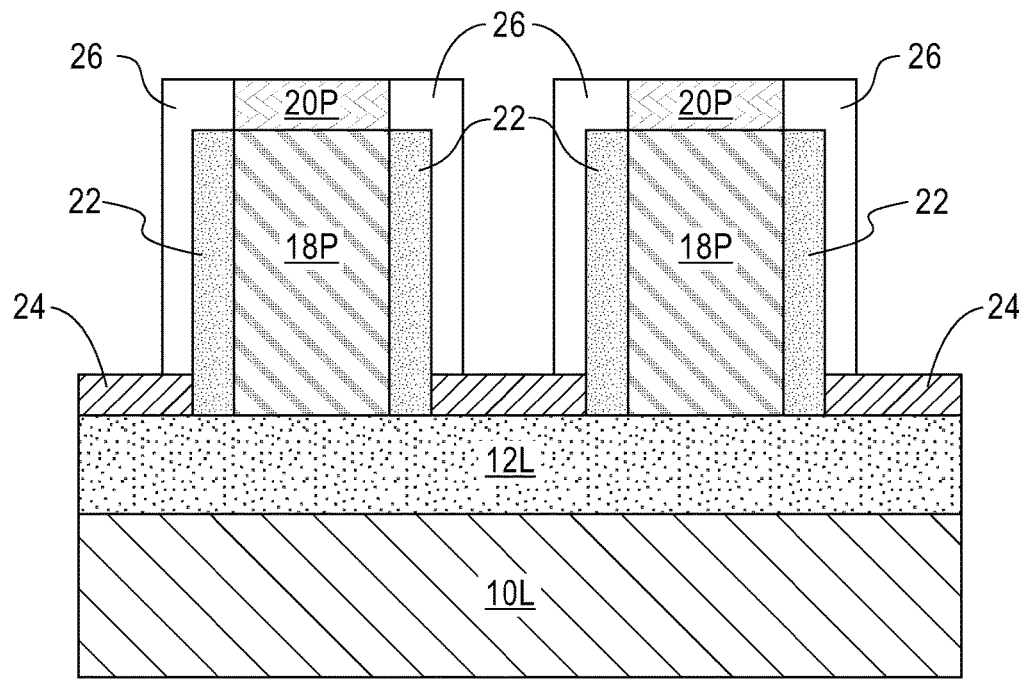
FIG. 5 is a cross sectional view of the exemplary semiconductor structure of FIG. 4 after forming a sacrificial spacer on the exposed surfaces of each strained semiconductor material pillar.

Referring now to FIG. 5, there is illustrated the exemplary semiconductor structure of FIG. 4 after forming a sacrificial spacer 26 on the exposed surfaces of each strained semiconductor material pillar 26. As is shown, each sacrificial spacer 26 has a bottommost surface that contacts a topmost surface of one of the sacrificial dielectric material layers 24, a first sidewall surface that contacts the exposed sidewalls and exposed topmost surface of one of the strained semiconductor material pillars 22, and a topmost surface that is coplanar with a topmost surface of each overlying hard mask portions 20P.

Each sacrificial spacer 26 is composed of a spacer dielectric material that has a different etch rate than at least the sacrificial dielectric material layer 24; the spacer dielectric material may have a same or different etch rate compared to the hard mask portion 20P. In one example, spacer dielectric material that provides each sacrificial spacer 26 may be composed of silicon dioxide, while the sacrificial dielectric material layer 24 may be composed of silicon nitride. Each sacrificial spacer 26 may be formed by first depositing a contiguous layer of the spacer dielectric material, and thereafter subjecting the contiguous layer of the spacer dielectric material to a spacer etching process. As is shown, the sacrificial spacers 26 do not completely fill in any gap that is located between strained semiconductor material pillars 22 that are present on the sidewalls of adjacent silicon germanium mandrel structures 18P.

Figure 6:
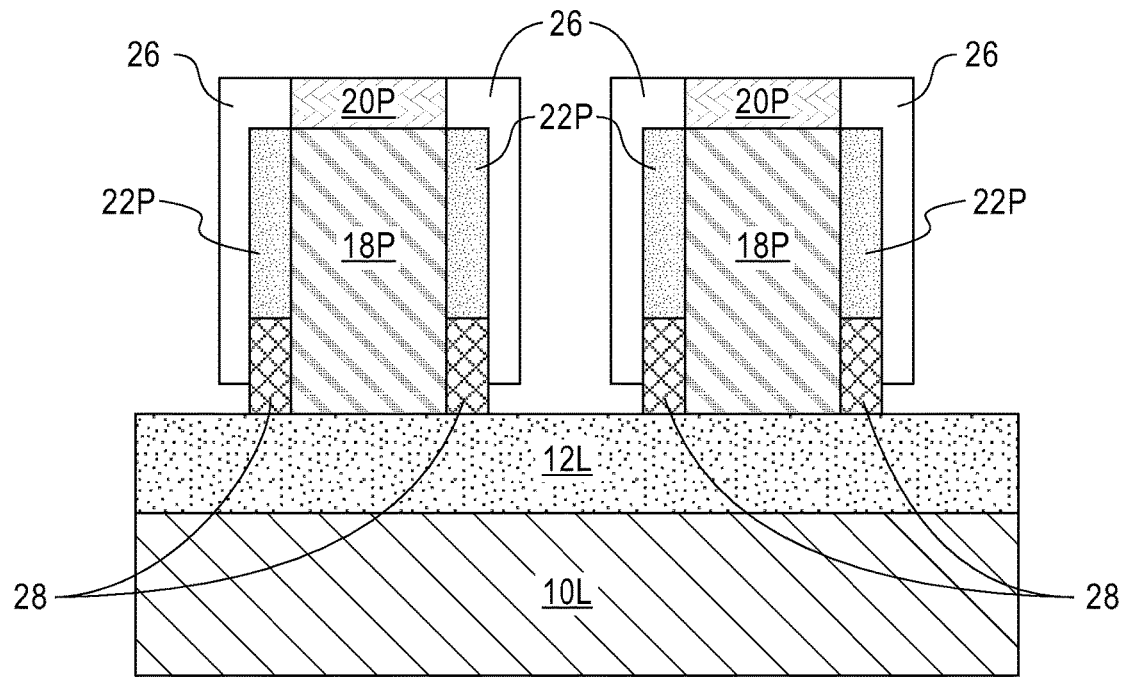
FIG. 6 is a cross sectional view of the exemplary semiconductor structure of FIG. 5 after removing the sacrificial dielectric material layer and forming a first doped semiconductor extension region into an exposed lower sidewall portion of each strained semiconductor material pillar.

Referring now to FIG. 6, there is illustrated the exemplary semiconductor structure of FIG. 5 after removing the sacrificial dielectric material layer 24 and forming a first doped semiconductor extension region 28 into an exposed lower sidewall portion of each strained semiconductor material pillar 22. Each first doped semiconductor extension region 28 is formed within a bottom portion of each strained semiconductor material pillar 22. The remaining portions of each strained semiconductor material pillar 22 can now be referred to herein as a strained semiconductor material pillar portion 22P; the strain within each strained semiconductor material pillar portion 22P is the same as the strain within each strained semiconductor material pillar 22.

The removing of the sacrificial dielectric material layer 24 is performed utilizing an etching process that is selective in removing the dielectric material that provides the sacrificial dielectric material layer 24 relative to each hard mask portion 20P and each sacrificial spacer 26. In one embodiment, and when the sacrificial dielectric material layer 24 is composed of silicon nitride, and the hard mask portions 20P and the sacrificial spacers 26 are composed of silicon oxide, hot phosphoric acid may be used to selectively remove the sacrificial dielectric material layer 24 relative to each hard mask portion 20P and each sacrificial spacer 26.

After removing each sacrificial dielectric material layer 24, a bottom portion of each strained semiconductor material pillar 22 is exposed. In some embodiments and as exemplified in FIG. 6, a first doped semiconductor extension region 28 is formed into the exposed lower sidewall portion of each strained semiconductor material pillar 22. In other embodiments, the first doped semiconductor extension region 28 may be formed after formation of a first epitaxial doped semiconductor structure (to be described herein below) by performing a drive-in anneal.

In the illustrated embodiment, the first doped semiconductor extension regions 28 can be formed utilizing a plasma doping process in which a p-type dopant or n-type is introduced into the exposed lower sidewall portion of each strained semiconductor material pillar 22P. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. Each first doped semiconductor extension region 28 may have a dopant concentration that can be within a range from $1\times10^{19}$ atoms/cm$^3$ to $1\times10^{21}$ atoms/cm$^3$.

Figure 7:
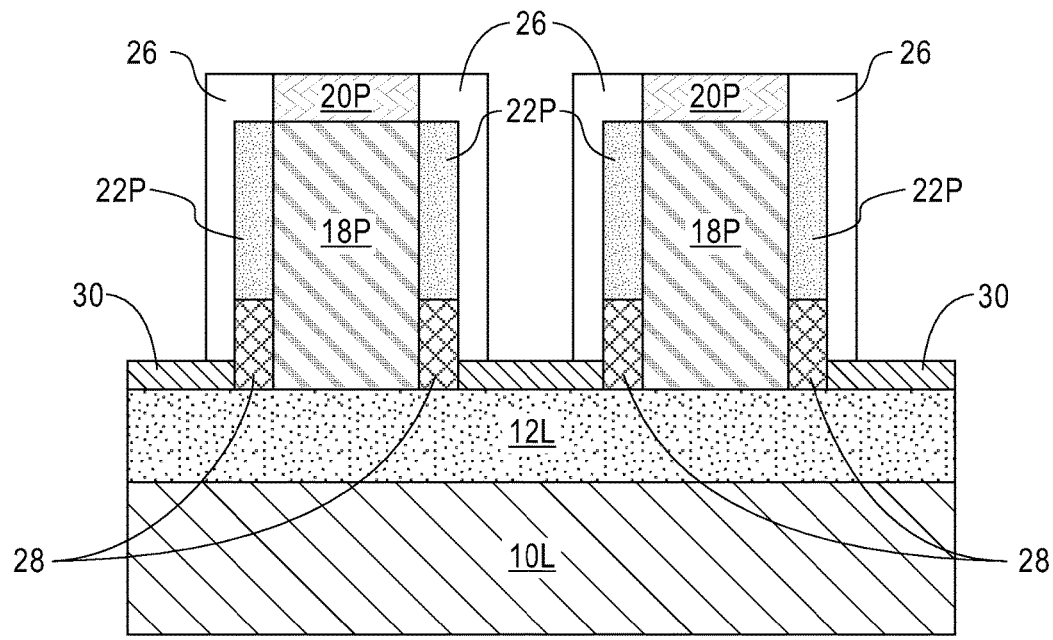
FIG. 7 is a cross sectional view of the exemplary semiconductor structure of FIG. 6 after forming a first epitaxial doped semiconductor structure from exposed sidewalls of each doped semiconductor extension region.

Referring now to FIG. 7, there is illustrated the exemplary semiconductor structure of FIG. 6 after forming a first epitaxial doped semiconductor structure 30 from exposed sidewalls of each first doped semiconductor extension region 28 (or from exposed lower sidewall portions of each strained semiconductor material pillar 22 in embodiments in which the first doped semiconductor extension regions 28 are not yet formed). Collectively, each first doped semiconductor extension region and each first epitaxial doped semiconductor structure 30 constituent a first portion of a first (or bottom) source/drain structure of the present application.

Each first epitaxial doped semiconductor structure 30 is composed of a semiconductor material and either a p-type dopant or n-type dopant, as mentioned above. In some embodiments, the semiconductor material that provides each first epitaxial doped semiconductor structure 30 may be the same as the semiconductor material that provides each strained semiconductor material pillar 22. In other embodiments, the semiconductor material that provides each first epitaxial doped semiconductor structure 30 may be different from the semiconductor material that provides each strained semiconductor material pillar 22. Each epitaxial doped semiconductor structure 30 may have a dopant concentration that can be within a range from $1\times10^{19}$ atoms/cm$^3$ to $4\times10^{21}$ atoms/cm$^3$. Each epitaxial doped semiconductor structure 30 serves as a portion of either a source region or a drain region of the resultant vertical transistor of the present application.

Each first epitaxial doped semiconductor structure 30 can be formed utilizing an epitaxial growth (or deposition) process as define above. In some embodiments, the dopant that is present in each first epitaxial doped semiconductor structure 30 can be added into the precursor gas or gas mixture that provides the semiconductor material of each first epitaxial doped semiconductor structure 30. In other embodiments, a dopant can be introduced into an intrinsic epitaxially grown semiconductor material utilizing one of ion implantation or gas phase doping such as to provide each first epitaxial doped semiconductor structure 30.

In some embodiments and as shown, a bottommost surface of each first epitaxial doped semiconductor structure 30 directly contacts a portion of a topmost surface of the underlying insulator layer 12L. In other embodiments (not shown), a bottommost surface of each first epitaxial doped semiconductor structure 30 directly contacts a portion of a topmost surface of the underlying silicon substrate. In either embodiment, each first epitaxial doped semiconductor structure 30 has an outermost sidewall surface that extends beyond the outermost sidewall of each sacrificial spacer 26.

Figure 8:
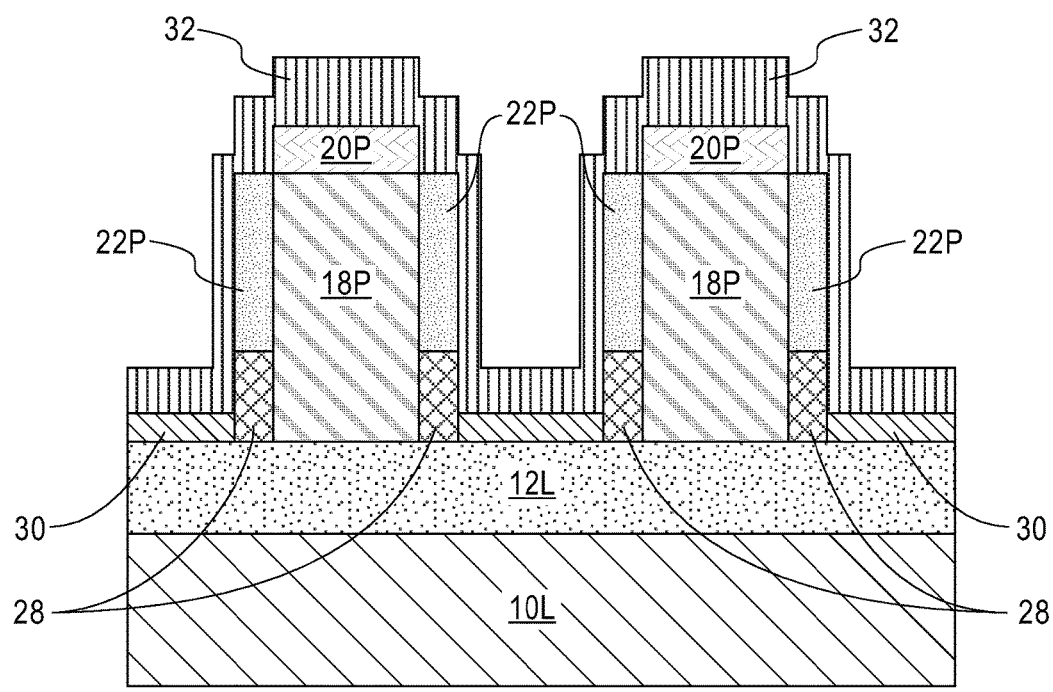
FIG. 8 is a cross sectional view of the exemplary semiconductor structure of FIG. 7 after directional deposition of a dielectric layer.

Referring now to FIG. 8, there is illustrated the exemplary semiconductor structure of FIG. 7 after directional deposition of a dielectric layer 32. As is shown, the dielectric layer 32 is a contiguous layer that covers the entirety of the exemplary semiconductor structure of FIG. 7. As is further shown, dielectric layer 32 has a first thickness that is present atop horizontal surfaces that is greater than a second thickness of the dielectric layer 32 that is present on vertical surfaces. In one embodiment of the present application, the dielectric layer 32 can be an oxide that is formed utilizing a high density plasma deposition process. In another embodiment, the dielectric layer 32 may be composed of a nitride such as silicon nitride, SiBCN, or SiOCN. In a still further embodiment, the dielectric layer 32 may be composed of multiple layered dielectrics.

Figure 9:
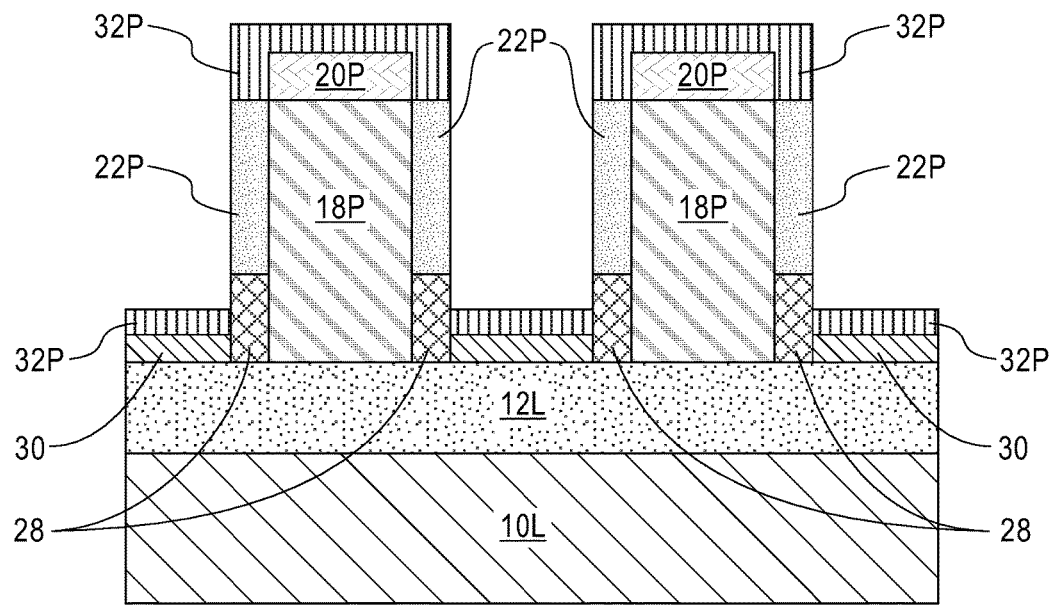
FIG. 9 is a cross sectional view of the exemplary semiconductor structure of FIG. 8 after etching back the dielectric layer.

Referring now to FIG. 9, there is illustrated the exemplary semiconductor structure of FIG. 8 after etching back the dielectric layer 32. Portions of the dielectric layer 32 remain on horizontal surfaces of the exemplary semiconductor structure after the etch. The remaining portions of the dielectric layer 32 are referred to herein as dielectric layer portions 32P. In one embodiment and when an oxide is used as the dielectric layer 32, a chemical oxide removal (COR) process can be used to etch back the dielectric layer 32. It is noted that the dielectric layer portions 32P that are present on the exposed topmost surface of each first epitaxial doped semiconductor structure 30 serves as a bottom spacer of the vertical transistor of the present application.

Figure 10:
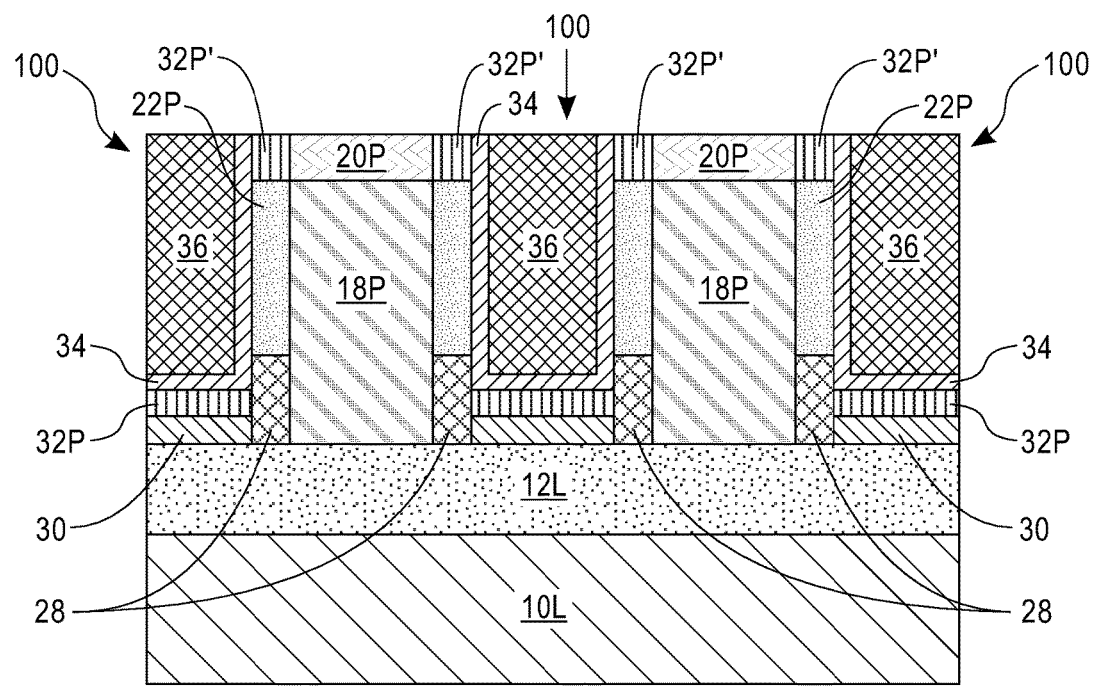
FIG. 10 is a cross sectional view of the exemplary semiconductor structure of FIG. 9 after forming a first functional gate structure along a first sidewall surface of a remaining portion of each strained semiconductor material pillar.

Referring now to FIG. 10, there is illustrated the exemplary semiconductor structure of FIG. 9 after forming a first functional gate structure 100 along a first sidewall surface of a remaining portion of each strained semiconductor material pillar (i.e., each strained semiconductor material pillar portion 22P). By "functional gate structure" it is meant a permanent gate structure used to control output current (i.e., flow of carriers in the channel) of a semiconducting device through electrical or magnetic fields. At this point of the present application, each first functional gate 100 includes a gate dielectric portion 34 and a gate conductor portion 36.

The gate dielectric portion 34 of each first functional gate structure 100 may include a gate dielectric material. The gate dielectric material that provides the gate dielectric portion 34 of each first functional gate structure 100 can be an oxide, nitride, and/or oxynitride. In one example, the gate dielectric material that provides the gate dielectric portion 34 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric portion 34. In some embodiments, a first set of first functional gate structures 100 includes a first gate dielectric portion, while a second set of first functional gate structures 100 comprises a second gate dielectric portion. In such an embodiment, the first gate dielectric material portion of each first functional gate structure of the first and second sets of first functional gate structures may be the same as, or different from, the second gate dielectric material portion.

The gate dielectric material used in providing the gate dielectric portion 34 of each first functional gate structure 100 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 34 can have a thickness in a range from 1 nm to 10 nm. Other thicknesses that are lesser than, or greater than, the aforementioned thickness range can also be employed for the gate dielectric material that may provide the gate dielectric portion 34.

The gate conductor portion 36 of each first functional gate structure 100 can include a gate conductor material. The gate conductor material used in providing the gate conductor portion 36 of each first functional gate structure 100 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, a first set of first functional gate structures includes a first gate conductor portion, while a second set of first functional gate structures comprises a second gate conductor portion. In such an embodiment, the first gate conductor portion may be the same as, or different from, the second gate conductor portion. For example, the first gate conductor portion may comprise an nFET gate metal, while the second gate conductor portion may comprise a pFET gate metal. In another example, the first gate conductor portion may comprise a pFET gate metal, while the second gate conductor portion may comprise an nFET gate metal.

The gate conductor material used in providing the gate conductor portion 36 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 36 has a thickness from 50 nm to 200 nm. Other thicknesses that are lesser than, or greater than, the aforementioned thickness range can also be employed for the gate conductor material used in providing the gate conductor portion 36.

Each first functional gate structure 100 can be formed by first providing a gate dielectric material and a gate conductor material, and thereafter a planarization process such as, for example, chemical mechanical polishing (CMP) can be used. The planarization process removes the dielectric layer portion 32P from atop each hard mask portion 20P as shown in FIG. 10. A portion of the dielectric layer portion 32P remains atop each strained semiconductor pillar portion 22P. This remaining portion dielectric layer portion 32P is labeled as element 32P' in FIG. 10. As is shown, the topmost surface of each gate conductor portion 36 is coplanar with a topmost surface of each gate dielectric portion 34 of each first functional gate structures 100 which in turn are coplanar with a topmost surface of each hard mask portion 20P.

Figure 11:
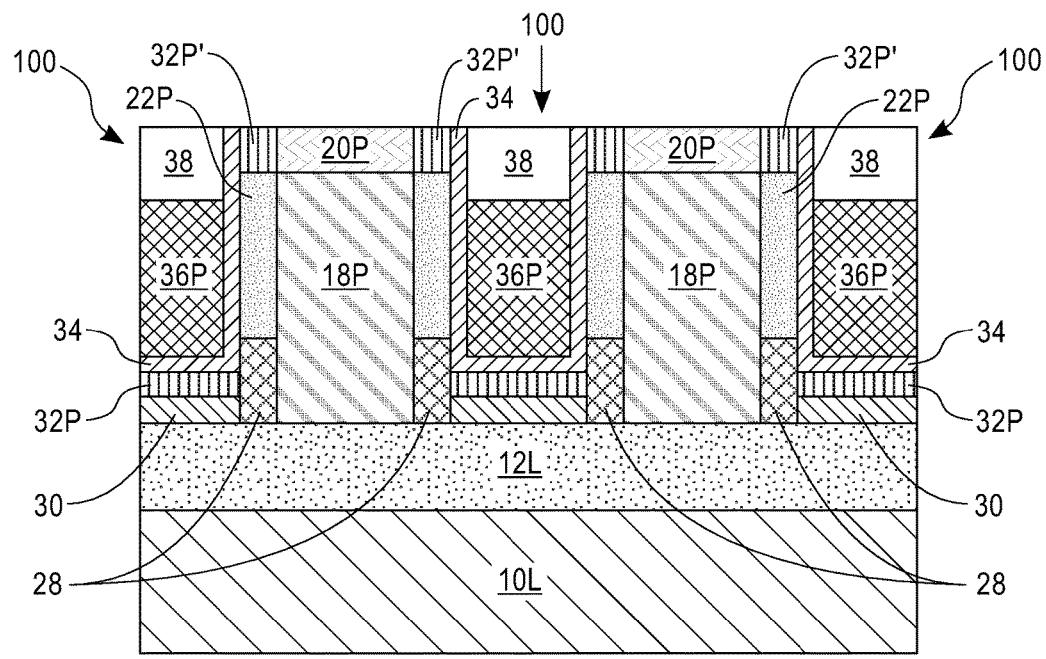
FIG. 11 is a cross sectional view of the exemplary semiconductor structure of FIG. 10 after recessing a gate conductor portion of each first functional gate structure and forming a gate cap within the recessed area.

Referring now to FIG. 11, there is illustrated the exemplary semiconductor structure of FIG. 10 after recessing a gate conductor portion 36 of each first functional gate structure 100 and forming a gate cap 38 within the recessed area. The remaining portion of each gate conductor portion 36 of each first functional gate structure 100 can now be referred to herein as a gate conductor structure 36P. The recessing of the gate conductor portion 36 of each first functional gate structure 100 comprises an etching process that is selective in removing a gate conductor material relative to the gate dielectric material that provides each gate dielectric portion 34, the dielectric layer portion 32P' and each hard mask portion 20P. After performing the selective etch to provide each gate conductor structure 36P, a gate cap material is deposited and then the gate cap material is planarized to provide the gate cap 38 shown in the exemplary semiconductor structure shown in FIG. 11. The gate cap material is composed of a dielectric material that is different from dielectric layer portion 32P' and hard mask portions 20P. In one example, the gate cap material is composed of silicon nitride or silicon oxynitride.

As is shown, the topmost surface of each gate gap 38 is coplanar with a topmost surface of each gate dielectric portion 34 of each first functional gate structures 100 which in turn are coplanar with a topmost surface of each hard mask portion 20P.

Figure 12:
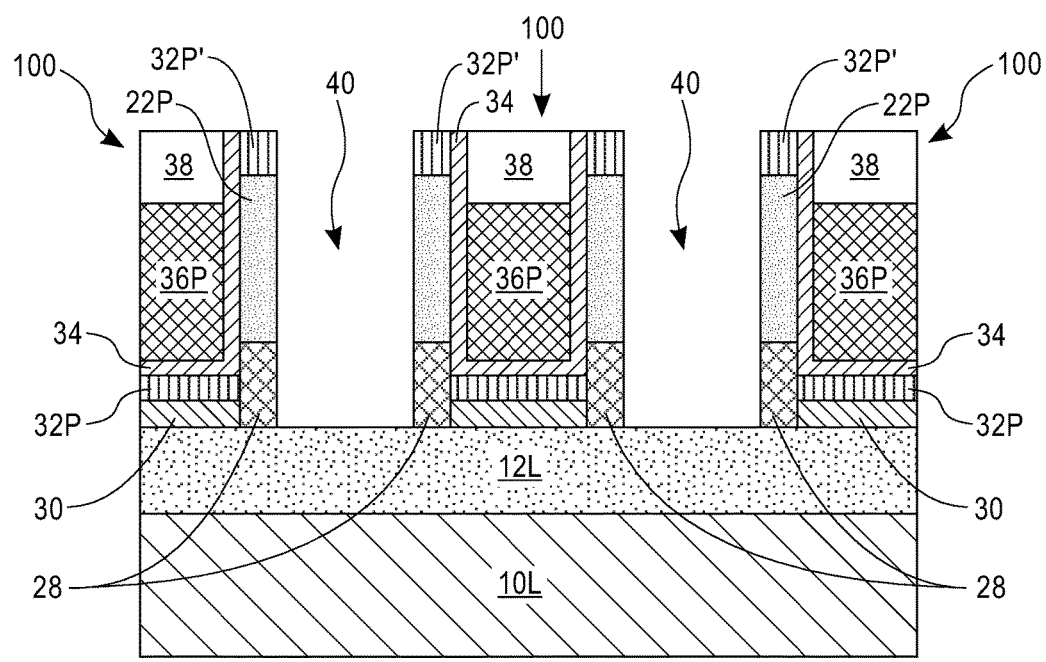
FIG. 12 is a cross sectional view of the exemplary semiconductor structure of FIG. 11 after removing each silicon germanium mandrel structure to provide gate cavities.

Referring now to FIG. 12, there is illustrated the exemplary semiconductor structure of FIG. 11 after removing each silicon germanium mandrel structure 18P to provide gate cavities 40. The removal of each silicon germanium mandrel structure 18P also includes the removal of each hard mask portion 20P from atop each silicon germanium mandrel structure 18P. The removal of the hard mask portions 20P may be performed prior to, or simultaneously with, the removal of the silicon germanium mandrel structures 18P. The removal of each hard mask portion 20P and each silicon germanium mandrel structure 18P may be performed utilizing a single anisotropic etching process (such as a reactive ion etch) or multiple anisotropic etching processes may be used. As is shown, each gate cavity 40 exposes a portion of a topmost surface of insulator layer 12L (or a portion of a topmost surface of a bulk silicon substrate) and at least a sidewall surface of each strained semiconductor material pillar 22P.

Figure 13A:
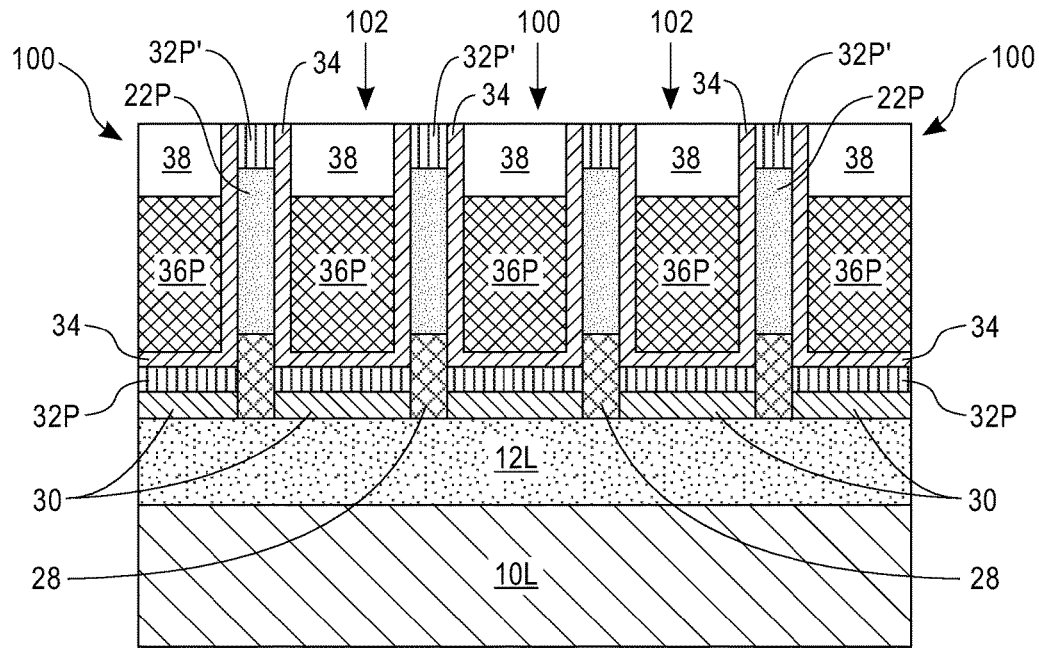
FIG. 13A is a cross sectional view of the exemplary semiconductor structure of FIG. 12 after forming a second portion of the first source/drain structure and a second functional gate structure in each gate cavity and along a second sidewall of the remaining portion of each strained semiconductor material pillar, wherein the second functional gate structure comprises the same gate dielectric material, gate conductor material and gate cap material as the first functional gate structure.

Referring now to FIG. 13A, there is illustrated the exemplary semiconductor structure of FIG. 12 after forming a second portion of the first source/drain structure and a second functional gate structure 102 in each gate cavity 40 and along a second sidewall of the remaining portion of each strained semiconductor material pillar (i.e., strained semiconductor material pillar portions 22P), wherein the second functional gate structure 102 comprises the same gate dielectric material, gate conductor material and gate cap material as the first functional gate structure 100. Another bottom spacer (i.e., dielectric layer portion 32P) is formed between the second portion of the first source/drain structure and the second functional gate structure 102. In this embodiment of the present application, each second functional gate structure 102 thus comprises a same gate dielectric portion 34, gate conductor structure 36P and gate cap 38 as the first functional gate structure 100. Each second functional gate structure 102 comprises the same gate dielectric portion 34, the gate conductor structure 36P and the same gate cap 38 as each first functional gate structure 100 can be formed utilizing the processing described above in providing the exemplary semiconductor structures of FIGS. 10 and 11.

The second portion of the first source/drain structure is formed by epitaxially growing another first epitaxial doped semiconductor structure 30 from the exposed sidewalls of the first doped semiconductor extension region 28. The another bottom spacer (i.e., dielectric layer portion 32P) is then formed above the another first epitaxial doped semiconductor structure 30 utilizing the same procedure mentioned above in forming dielectric layer portion 32P. The second functional gate structure 102 is then formed as described above.

Figure 13B:
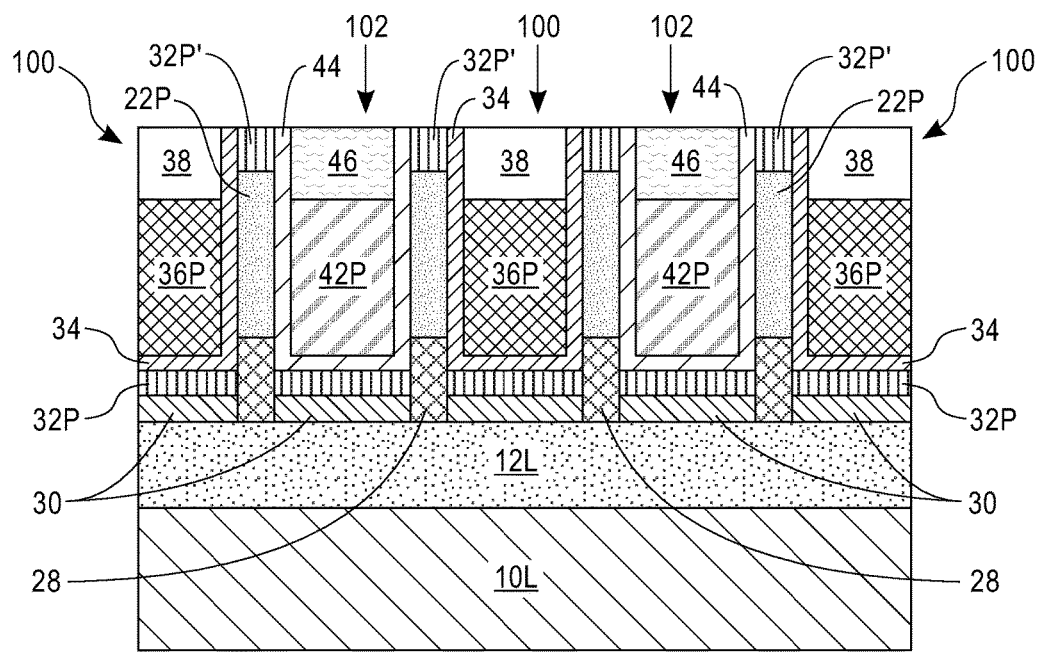
FIG. 13B is a cross sectional view of the exemplary semiconductor structure of FIG. 12 after forming a second portion of the first source/drain structure and a second functional gate structure in each gate cavity and along a second sidewall of the remaining portion of each strained semiconductor material pillar, wherein the second functional gate structure comprises a different gate dielectric material, a different gate conductor material and a different gate cap material than the first functional gate structure.

Referring now to FIG. 13B, there is illustrated the exemplary semiconductor structure of FIG. 12 after forming a second portion of the first source/drain structure (i.e., another first epitaxial doped semiconductor structure 30), another bottom spacer (i.e., dielectric layer portion 32P), and a second functional gate structure 102 in each gate cavity 40 and along a second sidewall of the remaining portion of each strained semiconductor material pillar (i.e., strained semiconductor material pillar portions 22P), in which the second functional gate structure 102 comprises a different gate dielectric material, a different gate conductor material and a different gate cap material than the first functional gate structure. In this embodiment, the different gate dielectric material of the second functional gate structures 102 provides gate dielectric portions 44, the different gate conductor material of the second functional gate structures 102 provides gate conductor structures 42P, and the different gate cap material provides of the second functional gate structures 102 provides gate caps 46. Although the present application describes and illustrates an embodiment in which all the components of the second functional gate structures 102 are composed of different materials than the first functional gate structures 100, the present application contemplates embodiments in which only one element or at most two elements (i.e., gate dielectric portion or gate conductor structure or gap cap) of the second functional gate structure 102 differs from the elements of the first functional gate structures. The second portion of the first source/drain structure (i.e., another first epitaxial doped semiconductor structure 30) and the another bottom spacer (i.e., dielectric layer portion) 32P can be formed as described above.

In either the embodiment shown in FIG. 13A or the embodiment shown in FIG. 13B, each strained semiconductor material pillar portion 22P is flanked on either side by a functional gate structure (100, 102).

Figure 14A:
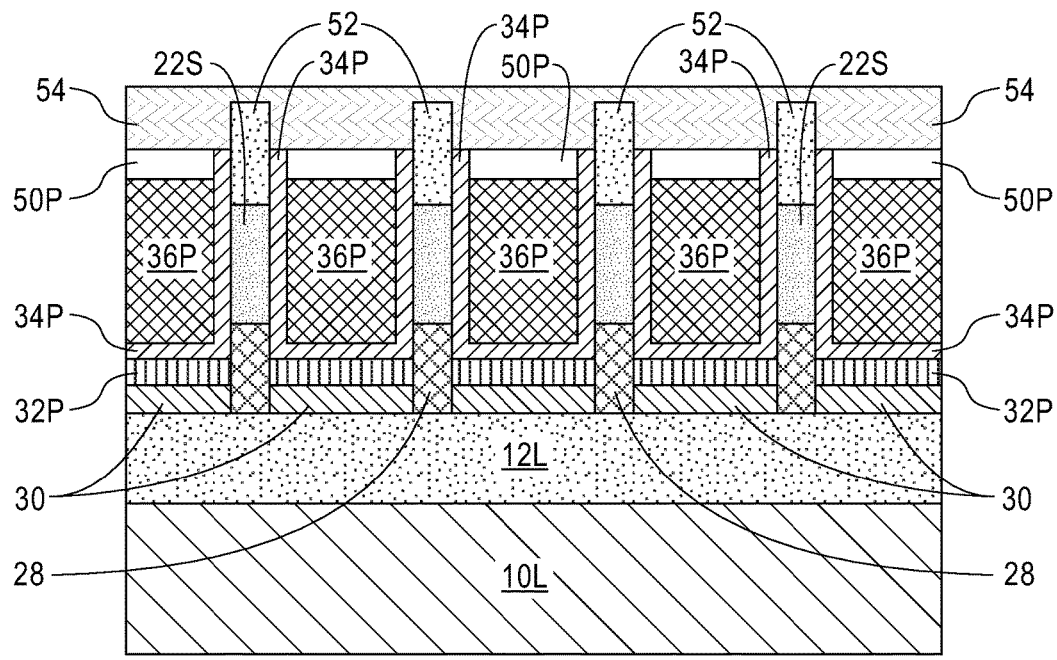
FIG. 14A is a cross sectional view of the exemplary semiconductor structure of FIG. 13A after forming a top spacer, a second doped semiconductor extension region within an upper portion of the remaining portion of each strained semiconductor material pillar, and forming a second epitaxial doped semiconductor structure.
Figure 14B:
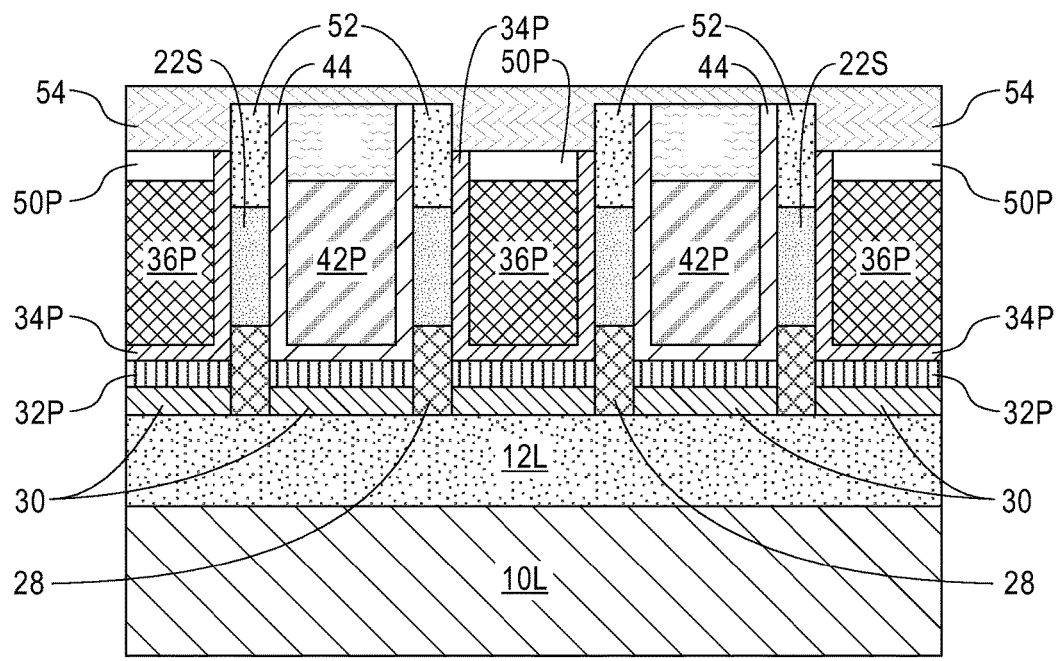
FIG. 14B is a cross sectional view of the exemplary semiconductor structure of FIG. 13B after forming a top spacer, a second doped semiconductor extension region within an upper portion of the remaining portion of each strained semiconductor material pillar, and forming a second epitaxial doped semiconductor structure.

Referring now to FIGS. 14A-14B, there are illustrated the exemplary semiconductor structures of FIG. 13A and FIG. 13B, respectively, after forming a top spacer 50P, a second doped semiconductor extension region 52 within an upper portion of the remaining portion of each strained semiconductor material pillar (i.e., strained semiconductor material pillar portions 22P), and forming a second epitaxial doped semiconductor structure 54. The remaining portion of each strained semiconductor material pillar portion 22P constitutes a strained semiconductor material channel pillar 22S of the present application. It is noted that in either the embodiment shown in FIG. 14A or the embodiment shown in FIG. 14B, each strained semiconductor material channel pillar 22S is flanked on either side by a functional gate structure (100, 102).

Top spacer 50P shown in FIG. 14A can be formed by removing each gate cap 38 utilizing a selective anisotropic etching process, and thereafter replacing each gate cap 38 with a gate spacer material such as, for example, an oxide; during the replacing of each gate cap 38, the remaining portion of the dielectric layer portion 32P' is also removed. The gate spacer material that provides each top spacer 50P shown in FIG. 14A can be formed by a deposition process. Following the deposition of the gate spacer material, a planarization process such as, for example, chemical mechanical polishing is employed to provide each top spacer 50P. In FIG. 14B, only the gap cap 38 is removed from the exemplary semiconductor structure shown in FIG. 12B and thereafter the top spacer 50 is formed as described above.

The second doped semiconductor extension region 52 and second epitaxial doped semiconductor structures 54 can be formed utilizing processes and materials similar to that mentioned above in forming the first doped semiconductor extension region 28 and first epitaxial doped semiconductor structures 30. Collectively, each second doped semiconductor extension region 52 and each second epitaxial doped semiconductor structure 54 constituent a second (or top) source/drain structure of the present application.

As is shown in FIG. 14A, the first and second functional gate structures 100, 102 comprise the same materials and have a same height. As is shown in FIG. 14B, the first and second functional gate structures 100, 102 comprise different materials (and are thus asymmetrical) and have different heights. In either embodiment, the strained semiconductor material channel pillar 22S has the same strain as the initial strained semiconductor material pillar 22.

In either embodiment, a semiconductor structure is provided that includes a strained semiconductor material channel pillar 22S located above a substrate (i.e., insulator layer 12L). A first functional gate structure 100 is located on a first sidewall of the strained semiconductor material channel pillar 22S and a second functional gate structure 102 is located on a second sidewall surface of the strained semiconductor material channel pillar 22S. A first (i.e., bottom) source/drain structure (combination of elements 28 and 30) is in contact with a bottommost surface of strained semiconductor material channel pillar 22A and extending beneath the first and second functional gate structures (100, 102), and a second source/drain structure (combination of elements 52 and 54) is in contact with a topmost surface of the strained semiconductor material channel pillar 22S and extending above the first and second functional gate structures 100, 102.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a strained semiconductor material channel pillar located above a substrate;
   a first functional gate structure located on a first sidewall of said strained semiconductor material channel pillar;
   a second functional gate structure located on a second sidewall surface of said strained semiconductor material channel pillar;
   a first source/drain structure in contact with a bottommost surface of said strained semiconductor material channel pillar and extending beneath said first and second functional gate structures;
   a second source/drain structure in contact with a topmost surface of said strained semiconductor material channel pillar and extending above said first and second functional gate structures; and
   a bottom spacer located between a bottommost surface of each of said first and second functional gate structures and a portion of said first source/drain structure.

2. The semiconductor structure of claim 1, further comprising a top spacer located between a topmost surface of each of said first and second functional gate structures and a portion of said second source/drain structure.

3. The semiconductor structure of claim 1, wherein said first source/drain structure comprises:
   a first doped semiconductor extension region having a topmost surface in direct physical contact with said bottommost surface of said strained semiconductor material channel pillar, and
   first epitaxial doped semiconductor structures extending from sidewalls of said first doped semiconductor extension region; and
said second source/drain structure comprises:
   a second doped semiconductor extension region having a bottommost surface in direct physical contact with said topmost surface of said strained semiconductor material channel pillar, and second epitaxial doped semiconductor structures extending from sidewalls of said second doped semiconductor extension region.

4. The semiconductor structure of claim 1, wherein said substrate is an insulator layer, and wherein a bottommost surface of said first source/drain structure is in direct physical contact with a topmost surface of said insulator layer.

5. The semiconductor structure of claim 1, wherein said strained semiconductor material channel pillar comprises tensily strained silicon, compressively strained germanium, a compressively strained silicon germanium alloy, or a tensily strained III-V compound semiconductor.

6. The semiconductor structure of claim 1, wherein said first and second functional gate structures comprise a same gate dielectric material and a same gate conductor material.

7. The semiconductor structure of claim 6, wherein said first and second functional gate structures have a same height.

8. The semiconductor structure of claim 6, wherein said first and second functional gate structures contain a gate dielectric portion having a topmost surface that extends above a topmost surface of a gate conductor structure.

9. The semiconductor structure of claim 1, wherein said first and second functional gate structures comprise at least one of a different gate dielectric material or a different gate conductor material.

10. The semiconductor structure of claim 9, wherein said first and second functional gate structures contain a gate dielectric portion having a topmost surface that extends above a topmost surface of a gate conductor structure.

11. The semiconductor structure of claim 9, wherein said first and second functional gate structures have different heights.

12. A method of forming a semiconductor structure, said method comprising:
    forming at least one silicon germanium mandrel structure on a surface of a substrate, wherein said at least one silicon germanium mandrel structure is strained;
    forming a strained semiconductor material pillar on opposing sidewalls of said at least one silicon germanium mandrel structure;
    forming, with said at least one silicon germanium mandrel structure present, a first portion of a first source/drain structure;
    forming a first functional gate structure on one side of each strained semiconductor material pillar;
    removing said at least one silicon germanium mandrel structure with said first functional gate stack in place to maintain the strain of each of said strained semiconductor material pillars;
    forming, on another side of each of said strained semiconductor material pillars, a second portion of said first source/drain structure and a second functional gate structure; and
    forming a second source/drain structure located above said first and second functional gate structures and in contact with a topmost surface of each of said strained semiconductor material pillars.

13. The method of claim 12, wherein said forming said at least one silicon germanium mandrel structure on said surface of said substrate comprises:
    epitaxially growing a silicon germanium alloy layer on a surface of a silicon layer;
    converting said silicon germanium alloy layer and said silicon layer into a strained silicon germanium alloy layer; and
    patterning said strained silicon germanium alloy layer.

14. The method of claim 12, wherein said forming said strained semiconductor material pillar comprises a lateral epitaxially growth process.

15. The method of claim 12, wherein
    said first source/drain structure comprises:
        a first doped semiconductor extension region having a topmost surface in direct physical contact with said bottommost surface of said strained semiconductor material pillar, and
        first epitaxial doped semiconductor structures extending from sidewalls of said first doped semiconductor extension region; and
    said second source/drain structure comprises:
        a second doped semiconductor extension region having a bottommost surface in direct physical contact with said topmost surface of said strained semiconductor material pillar, and
        second epitaxial doped semiconductor structures extending from sidewalls of said second doped semiconductor extension region.

16. The method of claim 12, wherein said first and second functional gate structures comprise a same gate dielectric material and a same gate conductor material.

17. The method of claim 12, wherein said first and second functional gate structures comprise at least one of a different gate dielectric material or a different gate conductor material.

18. The method of claim 12, further comprising forming a bottom spacer below said first and second functional gate structures, and forming a top spacer above said first and second functional gate structures.

19. The method of claim 12, forming comprising forming a bottom spacer below said first and second functional gate structures, and a top spacer above only said first functional gate structure.

* * * * *